US012770798B2

(12) United States Patent
Mohammadighaleni et al.

(10) Patent No.: US 12,770,798 B2
(45) Date of Patent: Oct. 20, 2026

(54) THIN FILM CAPACITORS

(71) Applicant: Intel Corporation, Santa Clara, CA (US)

(72) Inventors: Mahdi Mohammadighaleni, Phoenix, AZ (US); Benjamin Duong, Phoenix, AZ (US); Shayan Kaviani, Phoenix, AZ (US); Joshua Stacey, Chandler, AZ (US); Miranda Ngan, Chandler, AZ (US); Dilan Seneviratne, Chandler, AZ (US); Thomas Heaton, Mesa, AZ (US); Srinivas Venkata Ramanuja Pietambaram, Chandler, AZ (US); Whitney Bryks, Chandler, AZ (US); Jieying Kong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 145 days.

(21) Appl. No.: 17/948,586

(22) Filed: Sep. 20, 2022

(65) Prior Publication Data

US 2024/0096561 A1 Mar. 21, 2024

(51) Int. Cl.

| | |
|---|---|
| ***H01G 4/33*** | (2006.01) |
| ***H01G 4/008*** | (2006.01) |
| ***H01G 4/012*** | (2006.01) |
| ***H01G 4/14*** | (2006.01) |
| ***H05K 1/16*** | (2006.01) |
| ***H10D 1/00*** | (2025.01) |
| ***H10D 1/68*** | (2025.01) |
| ***H10W 90/00*** | (2026.01) |

(52) U.S. Cl.

CPC ............... *H01G 4/33* (2013.01); *H01G 4/012* (2013.01); *H05K 1/162* (2013.01); *H10D 1/043* (2025.01); *H10D 1/692* (2025.01); *H10D 1/716* (2025.01); *H01G 4/008* (2013.01); *H01G 4/145* (2013.01); *H05K 2201/095* (2013.01); *H05K 2201/09509* (2013.01); *H10W 90/00* (2026.01)

(58) Field of Classification Search

CPC ... H05K 2201/095; H05K 2201/09509; H05K 2201/09518; H05K 2201/09527; H05K 2201/09536; H05K 2201/09545; H05K 2201/09563; H05K 1/115; H01G 4/33; H10D 1/043; H10D 1/716; H10D 1/692

See application file for complete search history.

(56) References Cited

U.S. PATENT DOCUMENTS

2022/0406523 A1* 12/2022 Kamgaing ............. H01G 4/002
2023/0091666 A1* 3/2023 Duong ................. H05K 1/0298 174/260

* cited by examiner

*Primary Examiner* — Jose R Diaz
(74) *Attorney, Agent, or Firm* — Akona IP PC

(57) ABSTRACT

An apparatus, system, and method for in-situ three-dimensional (3D) thin-film capacitor (TFC) are provided. A 3D TFC can include a glass core, a through glass via (TGV) in the glass core including first conductive material, the first conductive material forming a first electrode of the 3D MIM capacitor, a second conductive material acting as a second electrode of the 3D MIM capacitor, and a dielectric material in contact with the first and second conductive materials, the dielectric material extending vertically and horizontally and physically separating the first and second conductive materials.

19 Claims, 13 Drawing Sheets

THIN FILM CAPACITORS

TECHNICAL FIELD

Embodiments pertain to thin-film capacitors.

BACKGROUND

Capacitance of a two-dimensional (2D) Thin Film Capacitor (TFC) is limited to the X-direction and the Y-direction and will be less than an equivalent (same material constituents) three-dimensional (3D) TFC that covers the same 2D area of the substrate. Capacitors are typically formed in a different process than the process used to form a die package.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In-situ thin film capacitors (TFCs) are required for improved power delivery performance in future products and can more easily be incorporated into any layer of the substrate as opposed to embedded TFCs. 3D architectures take advanced of the Z-direction to significantly increase the overall capacitor area and, thus, overall capacitance compared to their 2D, planar counterparts.

For a given set of materials, a proposed 3D TFC architecture of embodiments can produce in-situ devices with anywhere from 2 to greater than 10 times greater capacitance (e.g., due to increased capacitor area) compared to the 2D counterpart with the same X-Y area depending on the selected device dimensions. The multiple characteristic dimensions of the 3D devices also allow for high customizability of the final capacitance. Additionally, the added area in the 3D TFCs enable the use of lower dielectric constant, but easier-to-process materials to achieve the desired capacitance.

Embodiments regard at least three related, but different, 3D TFC architectures that enable much higher TFC capacitance per unit of substrate real estate area. The three architectures are called "Blind TGV with Pillar TFC", "Plated Through Hole (PTH) TFC", and Dual Lithography VIA (DLV) TFC. Each of the architectures has a unique appearance.

Figure 1:
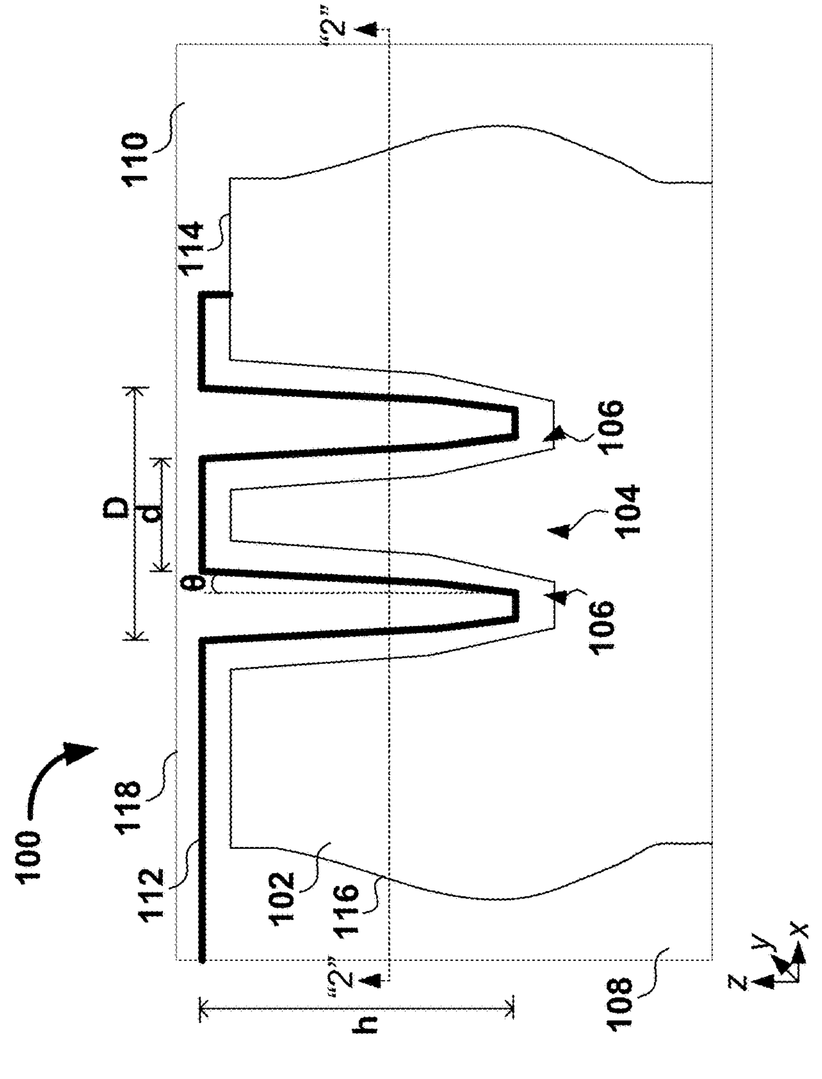
FIG. 1 illustrates, by way of example, a diagram of an embodiment of a blind TGV (BTGV) with pillar TFC.

FIG. 1 illustrates, by way of example, a diagram of an embodiment of a blind TGV with pillar TFC 100. The TFC 100 includes a glass core 102 etched with a hollow cylinder/tube shape. Glass is a state of a material and many materials can be in a glass state. Silicon dioxide, silica sand, soda ash, limestone, dolomite, and glass cullets are common materials that can be in a glass state. A material in a glass state is called a "glass" herein. The etching leaves a pillar 104 in the center of a trench formed by a blind through glass via (BTGV) 106. The BTGV 106 is filled with metal-insulator-metal (MIM) capacitor materials. The MIM capacitor materials include a conductive material 108, a thin-film dielectric material 112, and another conductive material 110. The conductive material 108, 110 is typically copper but can be another conductive material, such as gold, aluminum, a carbon-based conductor (e.g., a carbon nanotube or the like). The dielectric material 112 is a thin-film polymer, such as Polytetrafluoroethylene (PTFE), poly (1,3,5-trimethyl-1,3,5-trivinyl cyclotrisiloxane) (pV3D3), poly(1,3,5,7-tetravinyl-1,3,5,7-tetramethylcyclotetrasiloxane) (pV4D4), or the like. The conductive material 108 acts as a first conductive plate, the conductive material 110 acts as a second conductive plate, and the thin-film dielectric material 112 acts as a dielectric for the MIM capacitor.

The dielectric material 112 extends across the BTGV 106 such as to completely cover the BTGV 106. The dielectric material 112 extends along both sidewalls of the BTGV 106 and the bottom of the BTGV 106. The dielectric material 112 is about horizontal above the pillar and the horizontal extent of the dielectric material 112 over the pillar extends beyond sidewalls of the pillar 104. The dielectric material 112 physically separates the conductive material 108 from the conductive material 110. This description of the dielectric material 112 does not describe necessary features and variations to the shape and extent of the dielectric material 112 that are possible and within the scope of embodiments.

Figure 2:
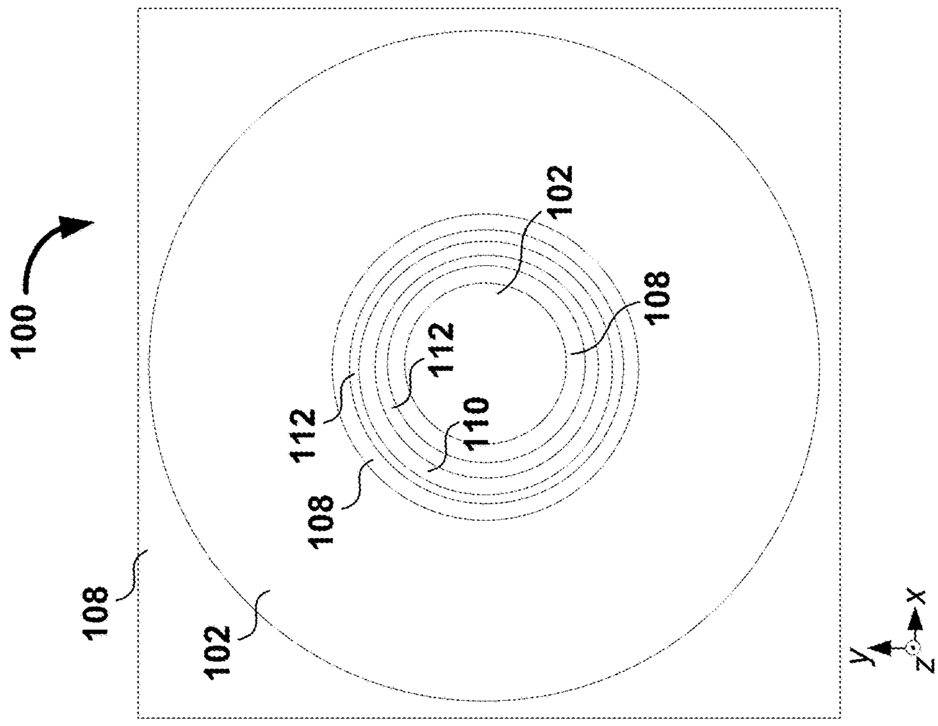
FIG. 2 illustrates, by way of example, a cross-section diagram of an embodiment of the TFC viewed from a direction indicated by arrows labelled "2" in FIG. 1.

The conductive material 108 is situated between the dielectric material 112 and the glass core 102 in the BTGV 106. The conductive material 108 can be situated on walls of the BTGV 106. The conductive material 108 can completely surround pillar 104. The conductive material 108 can be situated between the dielectric material 112 and the glass core 102 above a top surface 114 of the glass core 102. The conductive material 108 can surround (e.g., completely surround) an outer sidewall 116 of the glass core 102. Note the view in FIG. 1 is of a vertical cross-section. FIG. 2 illustrates a horizontal cross-section and can aid in understanding the description of FIG. 1. The TFC 100 forms a foundation for a die package. Redistribution layers (RDL) and other electrical layers can be formed on a top surface 118 of the TFC 100 and ultimately a die can be coupled to the capacitor through the RDL, other electrical layers, or a combination thereof.

Capacitance is defined by Equation 1:

$$C=\varepsilon A/s \qquad \text{Equation 1}$$

Where C is the capacitance, ε is the dielectric permittivity of the material between the conductive plates, A is the area of the conductive plates that is contiguous with the dielectric material 112, and s is the separation distance between the conductive plates. For a 2D capacitor over the same substrate area as the capacitor of FIG. 1, the area of the conductive plates is $\pi D^2/4$.

An area of the 3D TFC 100 of FIG. 1 is estimated by Equation 2:

$$\text{Area} = \pi\left(\frac{D}{2} - h\tan\theta\right)^2 + \pi h(D+d)\sqrt{(\tan\theta)^2 + 1} \qquad \text{Equation 2}$$

Where θ, h, D, and d are illustrated in FIG. 1. θ is the angle between vertical (z) and the dielectric material 112 along the trench wall. h is the height of the dielectric material 112 in the z-direction. D is an outer diameter extent of the dielectric material 112 that includes all vertical (greater than about zero z-direction) portions of the dielectric material 112 and horizontal portions between vertical portions. d is an extent of a horizontal portion over the pillar 104 and extending into one or more trenches formed by the BTGV 106. For the TFC 100, s is the thickness of the dielectric material 112. Relative dielectric permittivity, ε, is material specific. Typical ε values for dielectric polymers that are compatible with embodiments are in the range of about 2 to about 9.

FIG. 2 illustrates, by way of example, a cross-section diagram of an embodiment of the TFC 100 viewed from a direction and location indicated by arrows labelled "2" in FIG. 1. In this view, the layers from the outside one side to the outside on the opposite side of the TFC 100 are conductive material 108, glass core 102, conductive material 108, dielectric material 112, conductive material 110, dielectric material 112, conductive material 108, glass core 102, conductive material 108, dielectric material 112, conductive material 110, dielectric material 112, conductive material 108, glass core 102, and conductive material 108.

Figure 3A:
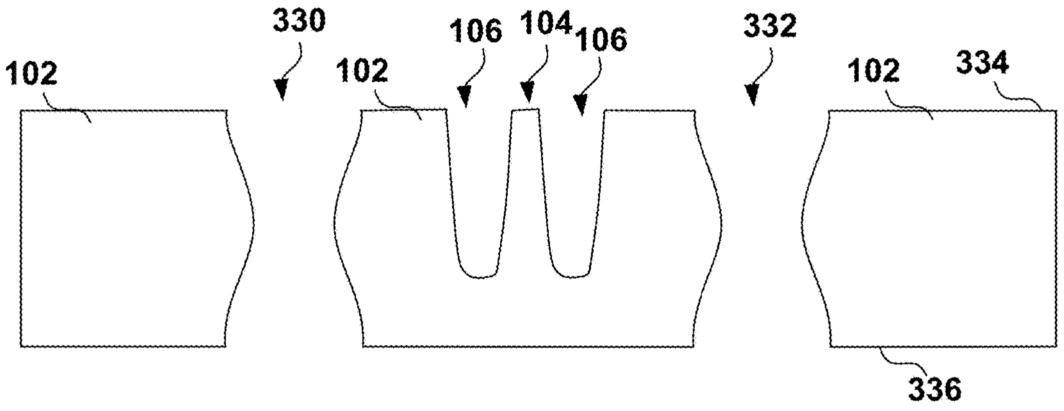
FIGS. 3A-3F illustrate, by way of example, respective stages of generating a device that includes a blind TGV (BTGV) thin-film capacitor (TFC).

FIGS. 3A-3F illustrate, by way of example, respective stages of generating a device that includes the 3D TFC 100. FIG. 3A illustrates a glass core 102 that has been processed to include through glass vias (TGVs) 330, 332 and a blind TGV (BTGV) 106. The TGVs 330, 332 can be created by grinding, etching, or otherwise removing the glass such that a hole extends from a top surface 334 of the glass core 102 all the way through the glass core 102 to an opposing bottom surface 336 of the glass core 102. The BTGV 106 extends from the top surface 334 of the glass core 102 and does not extend all the way through the glass core 102. The BTGV 106 can be generated by using a hollow, cylindrical tool or etching to remove a portion of the glass core 102.

Figure 3B:
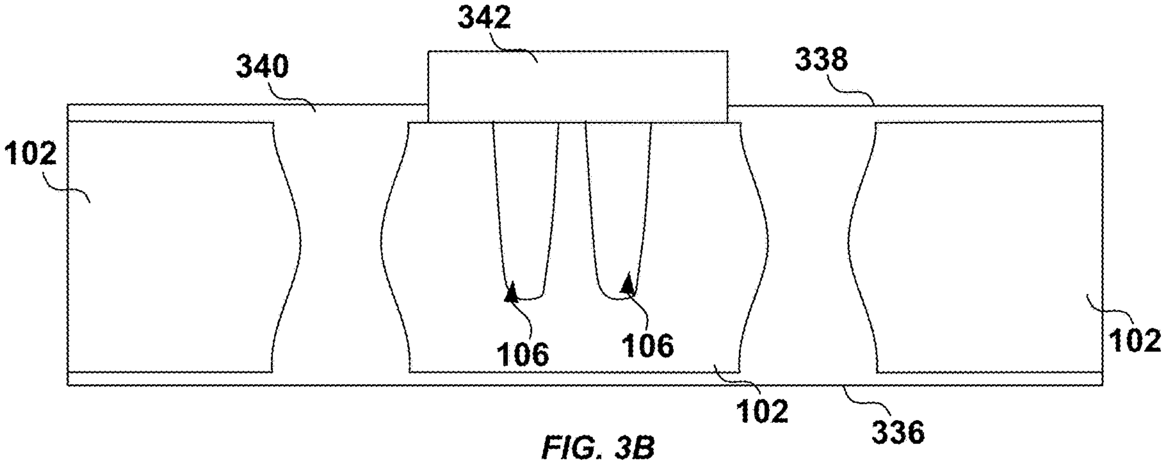

FIG. 3B illustrates the glass core of FIG. 3A after a mask 342 is situated to protect the BTGV 106. The TGVs 330, 332 are filled with conductive material 340. The conductive material 340 can be formed over portions of the glass core 102 that are not protected by the mask 342. The conductive material 340 can be etched or grinded to remove conductive material 340 that extends beyond a top surface 338 and to remove conductive material 340 that extends beyond the bottom surface 336. The conductive material 340 can be the same or different as the conductive material 108, 110.

Figure 3C:
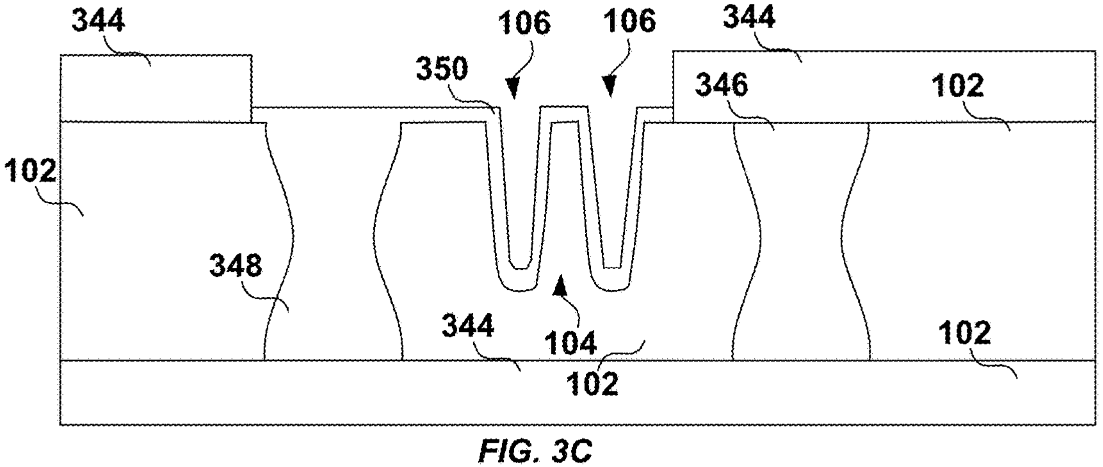

FIG. 3C illustrates the conductive glass core of FIG. 3B after the mask 342 is removed and another mask 344 is situated to protect a top surface of a plated through hole (PTH) 346 and an opposing bottom surface of both PTHs 346, 348. The mask 344 can also be situated to protect a portion of the glass core 102 outside of the PTH 348. The BTGV 106 includes a thin layer of conductive material 350. The conductive material in the PTH 348 is electrically connected to the conductive material 350. The conductive material 350 forms a first electrode for a 3D capacitor. The conductive material 350 conforms to the surface of the glass core 102, such as to adhere to sidewalls of the BTGV 106 and the top surface of the pillar 104.

Figure 3D:
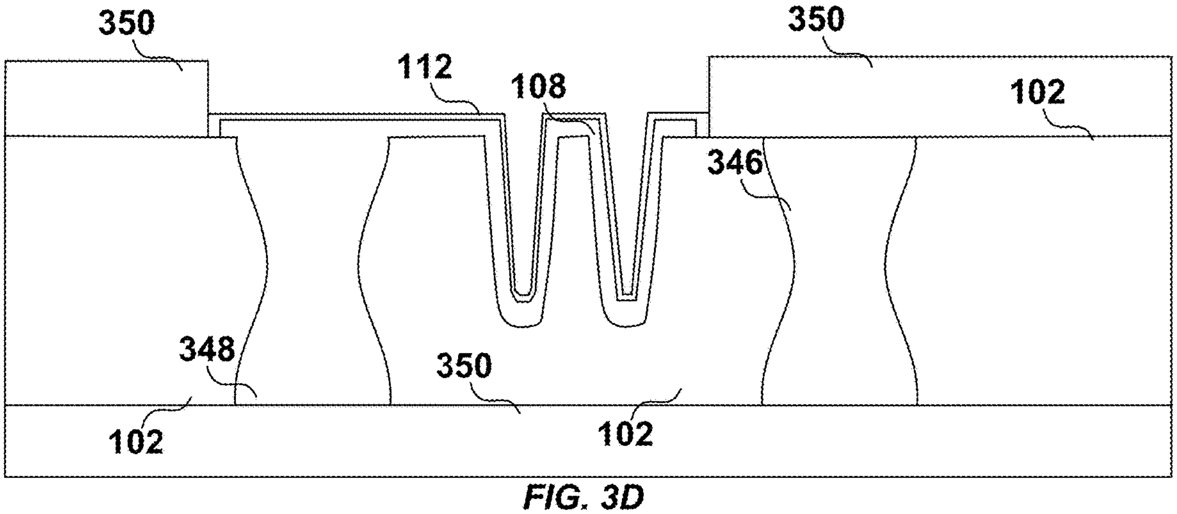

FIG. 3D illustrates the conductive glass core of FIG. 3C after the mask 344 is removed. In FIG. 3D, yet another mask 350 is situated to protect the exposed surfaces of the PTH 346, an exposed surface of the PTH 348, and portions of the glass core 102. The unmasked portions of the conductive glass core are coated with a dielectric material 112. The dielectric material 112 covers the conductive material 108. The dielectric material extends over a top surface of the PTH 348. The dielectric material 112 acts as an insulator for a 3D MIM capacitor. The dielectric material 112 can be conformally deposited on the conductive material 108. A vacuum-based chemical vapor deposition (CVD) technique, such as initiated CVD (iCVD) can be used to achieve the conformal deposition of the dielectric material 112. Alternative to a masked deposition of the dielectric material 112, the dielectric material 112 can be deposited using a blanket deposition and then etched away in desired locations.

Vacuum-based vapor deposition methods such as iCVD provides several advantages over other deposition techniques. First, iCVD is the only known method for controlled thin-film deposition of dielectric polymeric materials at low temperatures (from sub 10 nm to micron). Low temperatures means room temperatures (e.g., about 15 degrees Celsius to about 25 degrees Celsius). Second, iCVD deposition rate is significantly faster compared to other deposition techniques, such as atomic layer deposition (ALD) and physical vapor deposition (PVD) techniques. For example, the iCVD deposition rate is in the range of a few nanometer/minute, while ALD deposition rate is range of a few Angstroms/minute. Third, iCVD reactants, including monomer and initiator, are made of abundant and cost-effective elements. Fourth, iCVD of dielectric polymers enables the conformal deposition of high aspect ratio and three-dimensional (3D) features.

The dielectric material 112 can include measurable amounts of an initiator used to initiate a polymerization reaction that results in the dielectric material 112. The initiator can include tert-Butyl peroxide (TBPO), Perfluorooctanesulfonyl fluoride (PFOSF), tert-amyl peroxide (TAPO), trimethylamine (TEA), or the like. Other deposition techniques do not include the initiator.

Monomers for iCVD are mainly made of carbon, nitrogen, oxygen, hydrogen, and other abundant elements, which make the dielectric material 112 inexpensive. To complete the polymerization reaction on the surface, a thermally activated initiator radical activates the monomer on the surface (substrate), and polymerization starts on the surface.

Figure 3E:
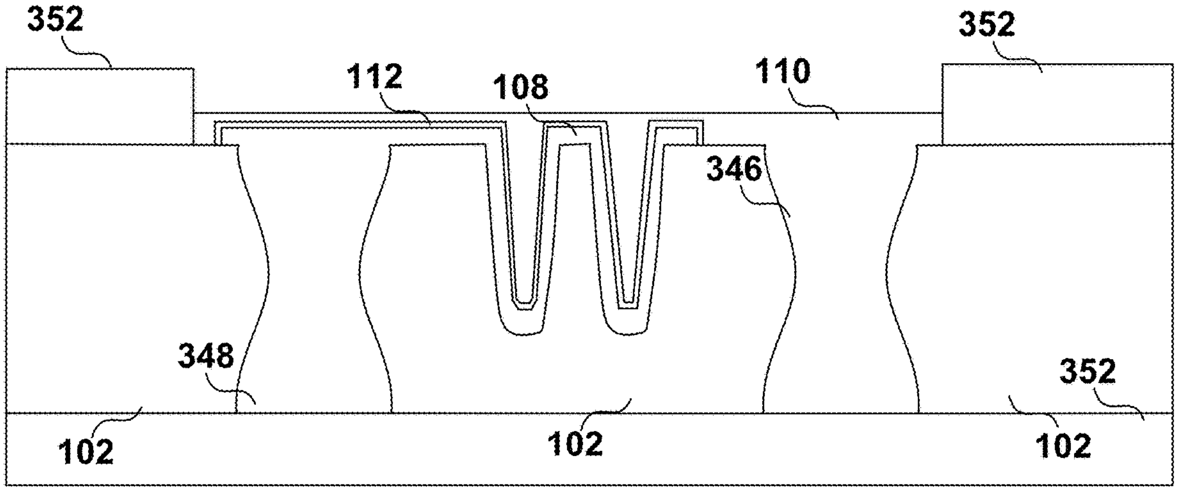
Figure 3F:
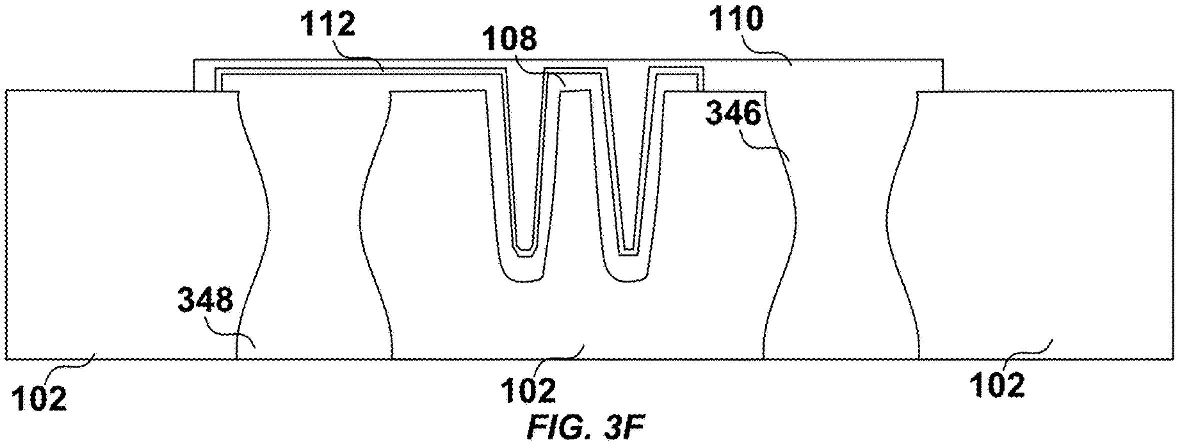

FIG. 3E illustrates a fully formed TFC. The mask 350 can be stripped and yet another mask 352 can be patterned for conductive material 110 plating. The mask 352 can be situated to allow the conductive material 110 to electrically and physical connect with the PTH 346. The PTH 346 with the conductive material 110 can form a second electrode for the TFC. The conductive material 110 can extend over both PTHs 346, 348 but only physically contact the PTH 346. The conductive material 110 can fill the remaining unfilled portion of the BTGV 106. The conductive material 110 can extend over the pillar 104, such that a material stack over the pillar 104 includes the conductive material 108 in contact with the pillar, the dielectric material 112 on and in contact with the conductive material 108, and the conductive material 110 on and in contact with the dielectric material 112. FIG. 3F illustrates the fully formed TFC of FIG. 3E after the mask 352 is removed.

Note that electrodes are not required to be electrically connected or formed using directly adjacent PTHs. Further, more than one 3D TFC can be formed, such as to create an array of TFCs.

Figure 4:
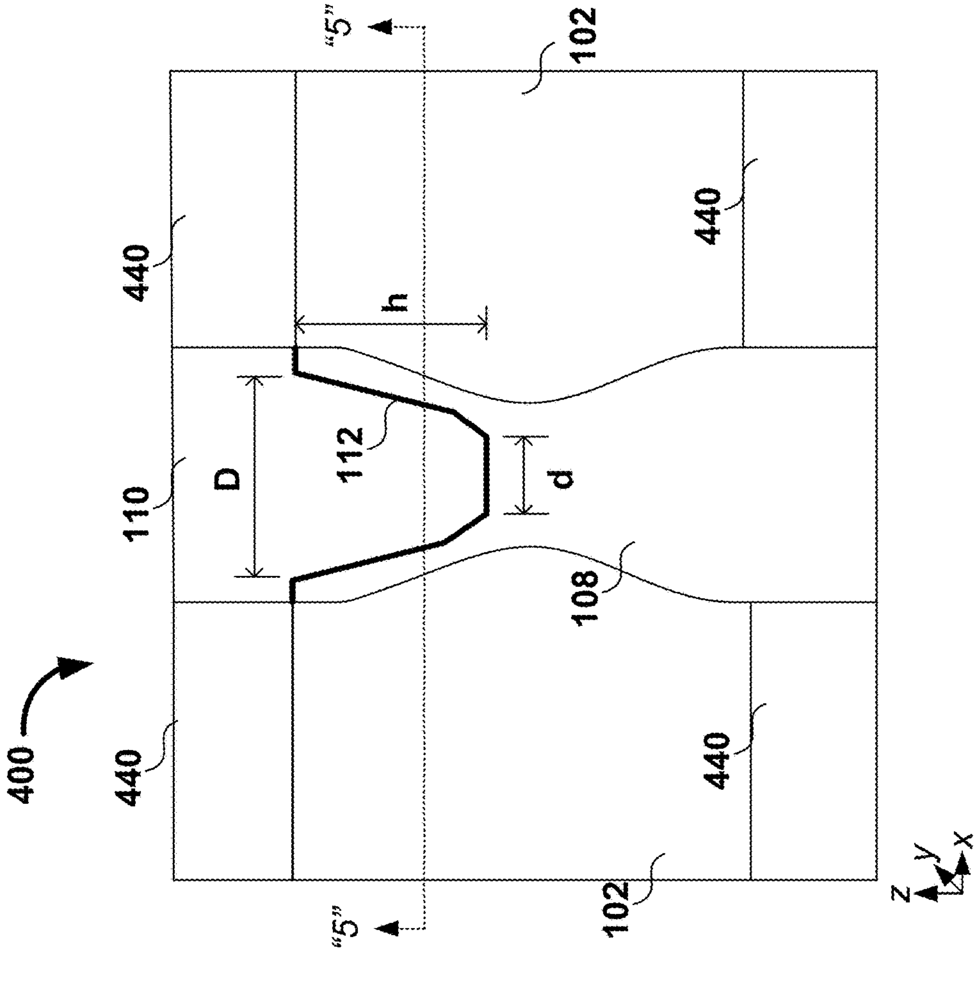
FIG. 4 illustrates, by way of example, a diagram of another embodiment of a 3D TFC formed in a plated through hole (PTH) of a glass core.

FIG. 4 illustrates, by way of example, a diagram of another embodiment of a 3D TFC 400 formed in the glass core 102. The 3D TFC 400 is a PTH TFC. The 3D TFC of FIG. 4 is formed entirely in a TGV as opposed to the TFC formed using the BTGV and TGV that is illustrated in FIGS. 1, 2, 3E, and 3F.

The 3D TFC of FIG. 4 includes a first electrode that is formed in the TGV using the conductive material 108, the dielectric material 112 that is deposited on the conductive material 108, and a second electrode that is formed using the conductive material 110. A buffer layer 440 can be situated to aid in forming RDL and further layers on top of the 3D TFC 400. Techniques for forming the TFC 400 are illustrated and described regarding FIGS. 6A-6F.

An area of the electrode of the 3D TFC 400 of FIG. 4 is estimated as in Equation 4:

$$\text{Area} = \frac{\pi d^2}{4} + \pi(D + d)\sqrt{(D - d)^2 + h^2}$$

Where h, D, and d are illustrated in FIG. 4. h is the height of the dielectric material 112 in the z-direction. D is an outer diameter extent of the dielectric material 112 in the TGV that includes all vertical (greater than about zero z-direction) portions of the dielectric material 112 and horizontal portions between vertical portions. d is an extent of a horizontal portion in a bottom of the trench. For a 2D capacitor over the same substrate area as the capacitor of FIG. 4, the area of the conductive plates is $\pi D^2/4$.

Figure 5:
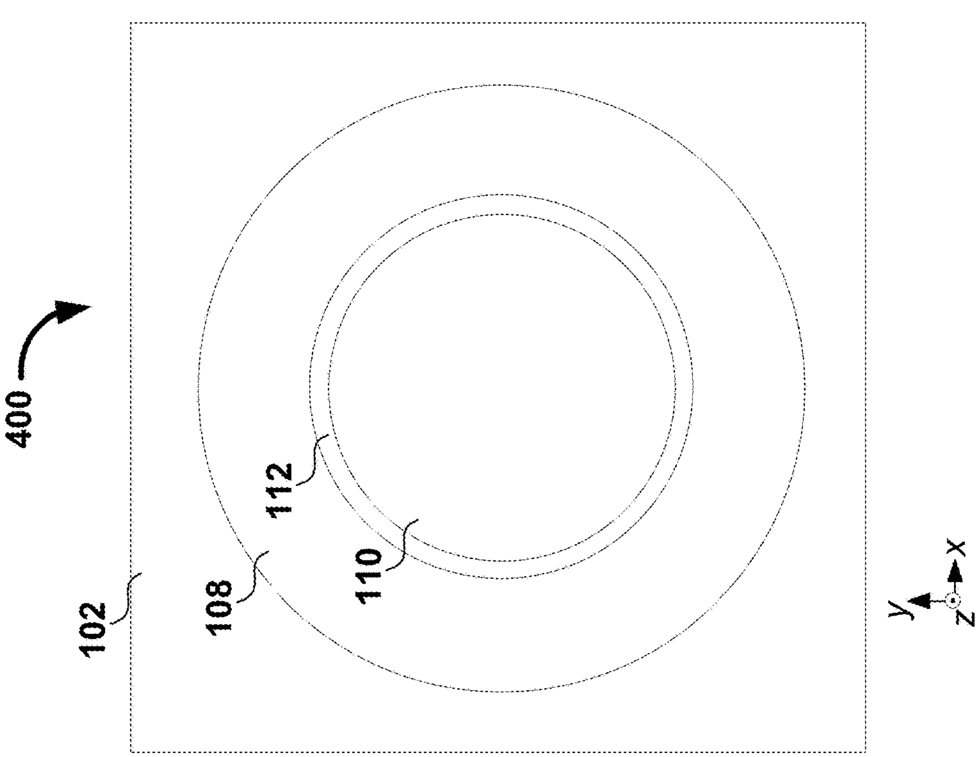
FIG. 5 illustrates, by way of example, a horizontal cross-section of the 3D TFC at a location indicated by arrows labelled "5" in FIG. 4.

FIG. 5 illustrates, by way of example, a horizontal cross-section of the 3D TFC 400 at a location indicated by arrows labelled "5" in FIG. 4. In this view, the materials from the outside on one side to the outside on the opposite side of the 3D TFC 400 are glass core 102, conductive material 108, dielectric material 112, conductive material 110, dielectric material 112, conductive material 108, and glass core 102.

Figure 6A:
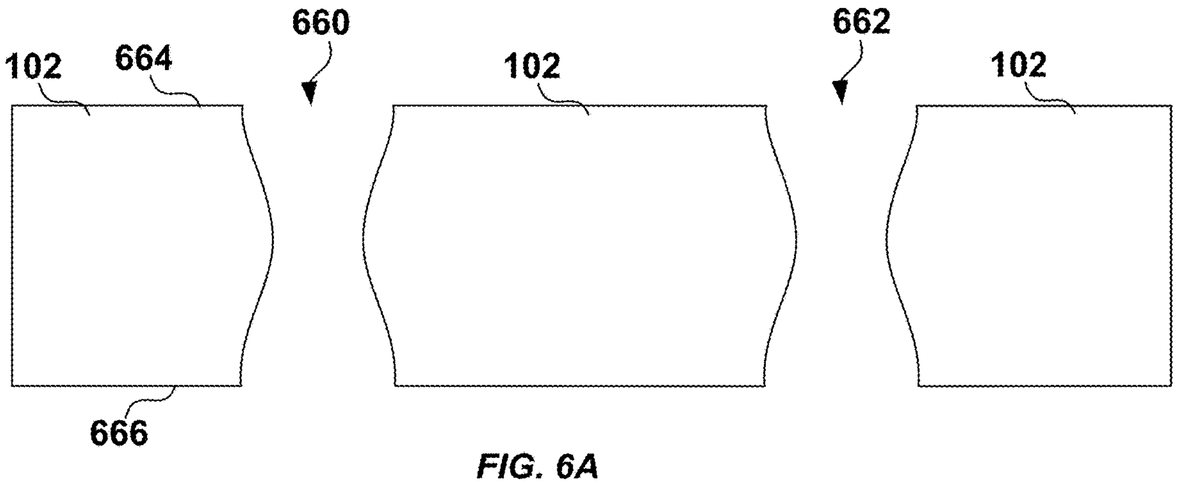
FIGS. 6A-6F illustrate, by way of example, respective stages of generating a device that includes a plated through hole (PTH) TFC.

FIGS. 6A-6F illustrate, by way of example, respective stages of generating a device that includes the 3D TFC 400. FIG. 6A illustrates a glass core 102 that has been processed to include through glass vias (TGVs) 660, 662. The TGVs 660, 662 can be created by grinding, etching, or otherwise removing the glass such that a hole extends from a top surface 664 of the glass core 102 all the way through the glass core 102 to an opposing bottom surface 666 of the glass core 102.

Figure 6B:
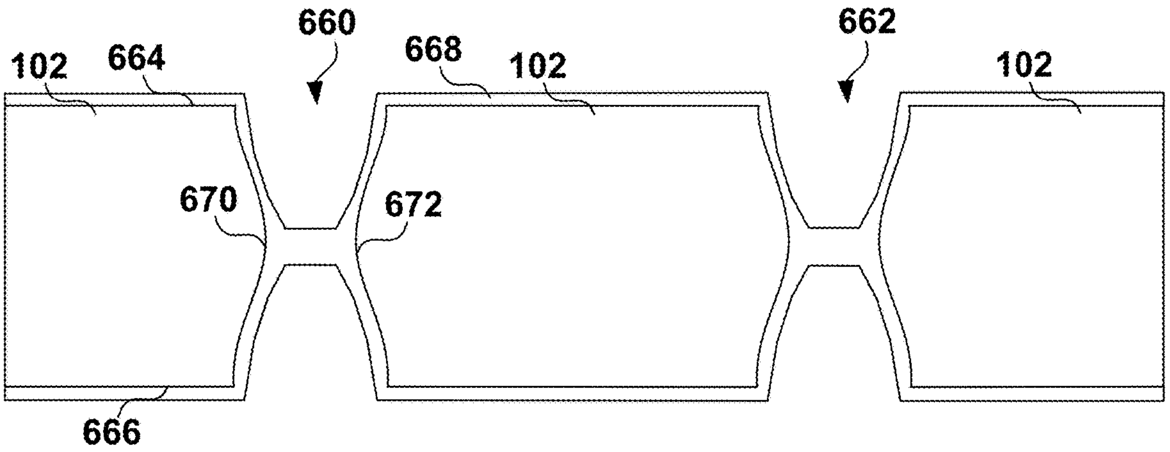

FIG. 6B illustrates the glass core of FIG. 6A after a conductive material 668 has been seeded and formed on the glass core 102. The conductive material 668 can cover the top surface 664, the bottom surface 666, and sidewalls 670, 672 of TGVs 660, 662. The conductive material 668 can span a gap in the TGVs 660, 662 so as to electrically connect the conductive material 668 on opposing sidewalls 670, 672 of the TGVs.

Figure 6C:
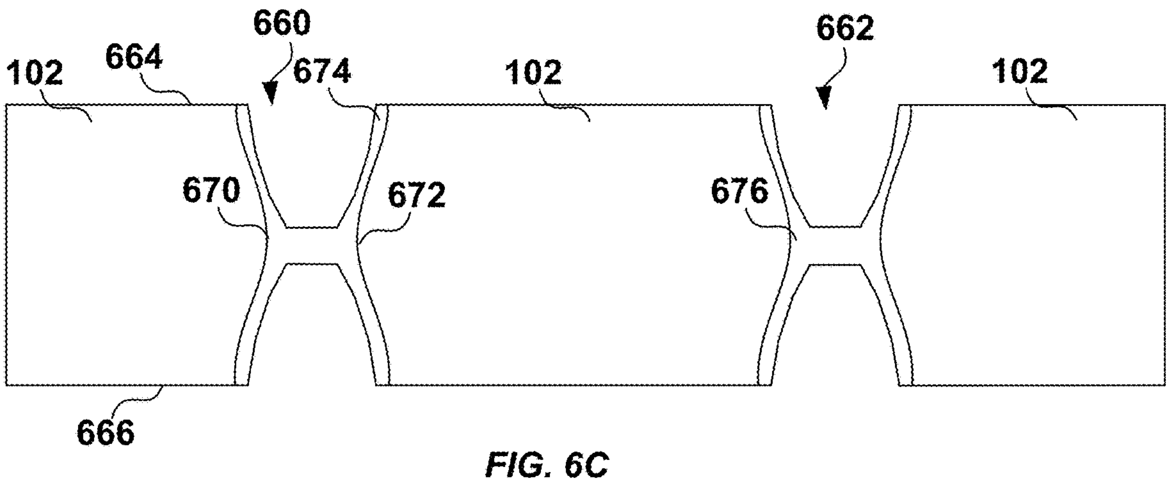

FIG. 6C illustrates the conductive glass core of FIG. 3C after a chemical-mechanical planarization (CMP), or other process that removes a portion of the conductive material 668, has removed the conductive material 668 from the top surface 664 and the bottom surface 666. Removing the conductive material 668 from the top surface 664 and the bottom surface 666 electrically isolates conductive material 674 in the TGV 660 from conductive material 676 in the TGV 662.

Figure 6D:
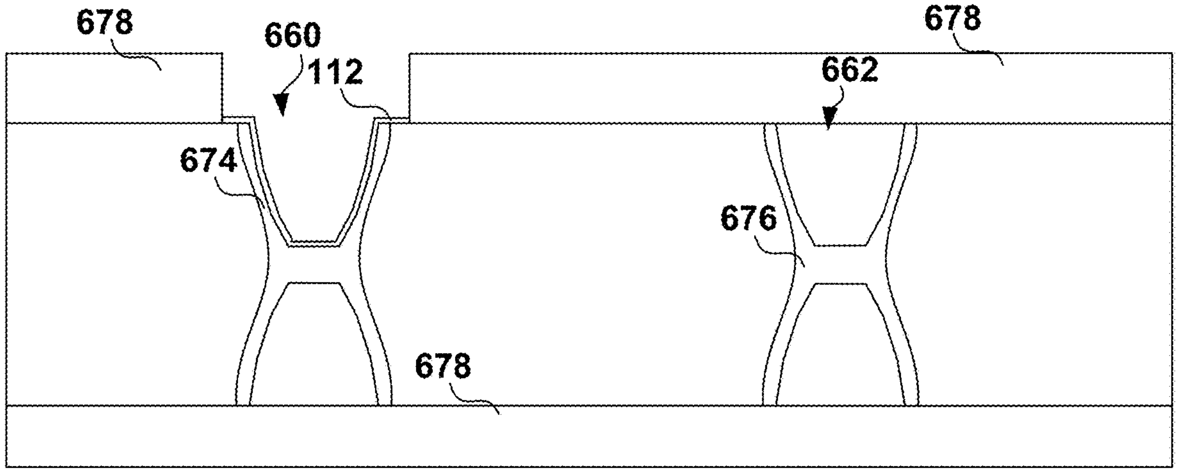

FIG. 6D illustrates the conductive glass core of FIG. 6C after a mask 344 is patterned for dielectric material 112 deposition. In FIG. 6D a mask 678 is situated to protect the exposed surfaces of the TGV 662, an exposed surface of the TGV 660, and portions of the glass core 102. The unmasked portions of the conductive glass core are coated with a dielectric material 112. The dielectric material 112 covers the conductive material 674. The dielectric material 112 extends over a top surface of the TGV 660. The dielectric material 112 acts as an insulator for a 3D MIM capacitor. The dielectric material 112 can be conformally deposited on the conductive material 108, such as by using ALD, CVD, iCVD, or the like. Alternative to a masked deposition of the dielectric material 112, the dielectric material 112 can be deposited using a blanket deposition and then etched away in desired locations.

Figure 6E:
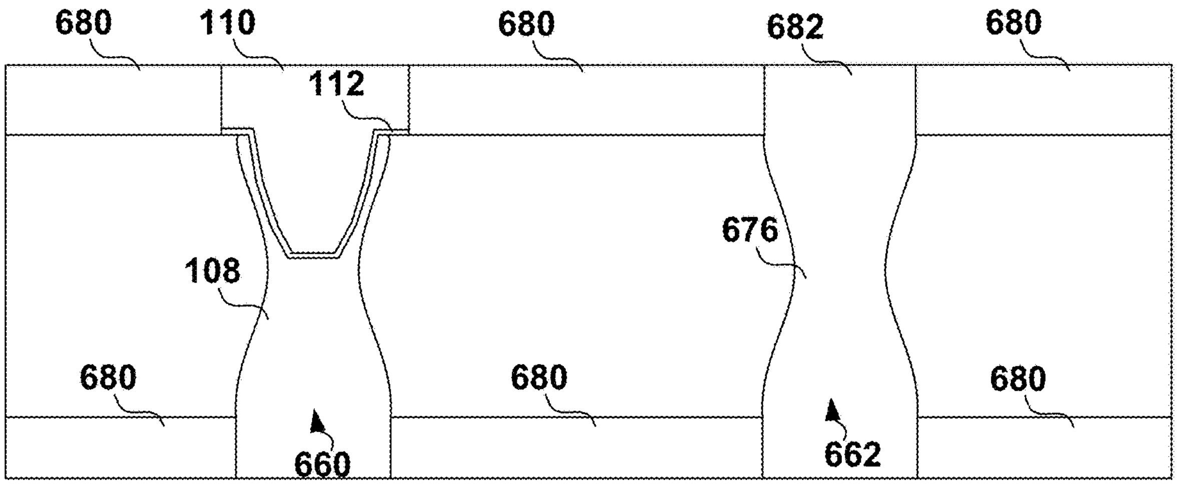

FIG. 6E illustrates a fully formed TFC. The mask 678 can be stripped and another mask 680 can be patterned for conductive material 110 plating, such as by lithography via (LiV) plating. The mask 680 can be situated to define a shape of the conductive material 110. The conductive material 110 can form a second electrode for the 3D TFC. The conductive material 110 can extend over only the TGV 660 and not over the TGV 662. The conductive material 110 can fill the remaining unfilled portion of the TGV 660 above and below the dielectric material 112.

Figure 6F:
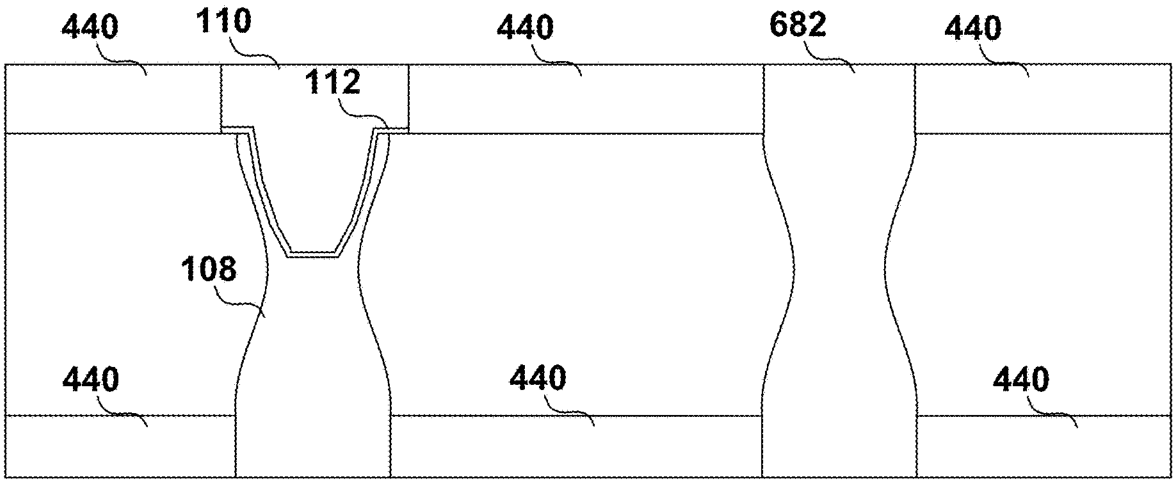

FIG. 6F illustrates the fully formed 3D TFC of FIG. 6E after the mask 680 is removed. A buffer layer 440 is laminated or coated on exposed portions of the glass core 102. The buffer layer 440 can be processed to expose the conductive material 110, 108, and 682. The buffer layer 440 can be processed to be generally coplanar with exposed surfaces of the conductive material 110, 108, and 682. Processing the buffer layer 440 can include CMP. The buffer layer 440 can include an Ajinomoto buildup film (ABF) or the like.

The operations of FIG. 6F can be performed before the operations of FIG. 6E. That is, the buffer layer 440 can be situated before the masking layer 680. If a photo-imageable dielectric (PID) material is used as the buffer layer 440, the CMP process may be avoided.

Figure 7:
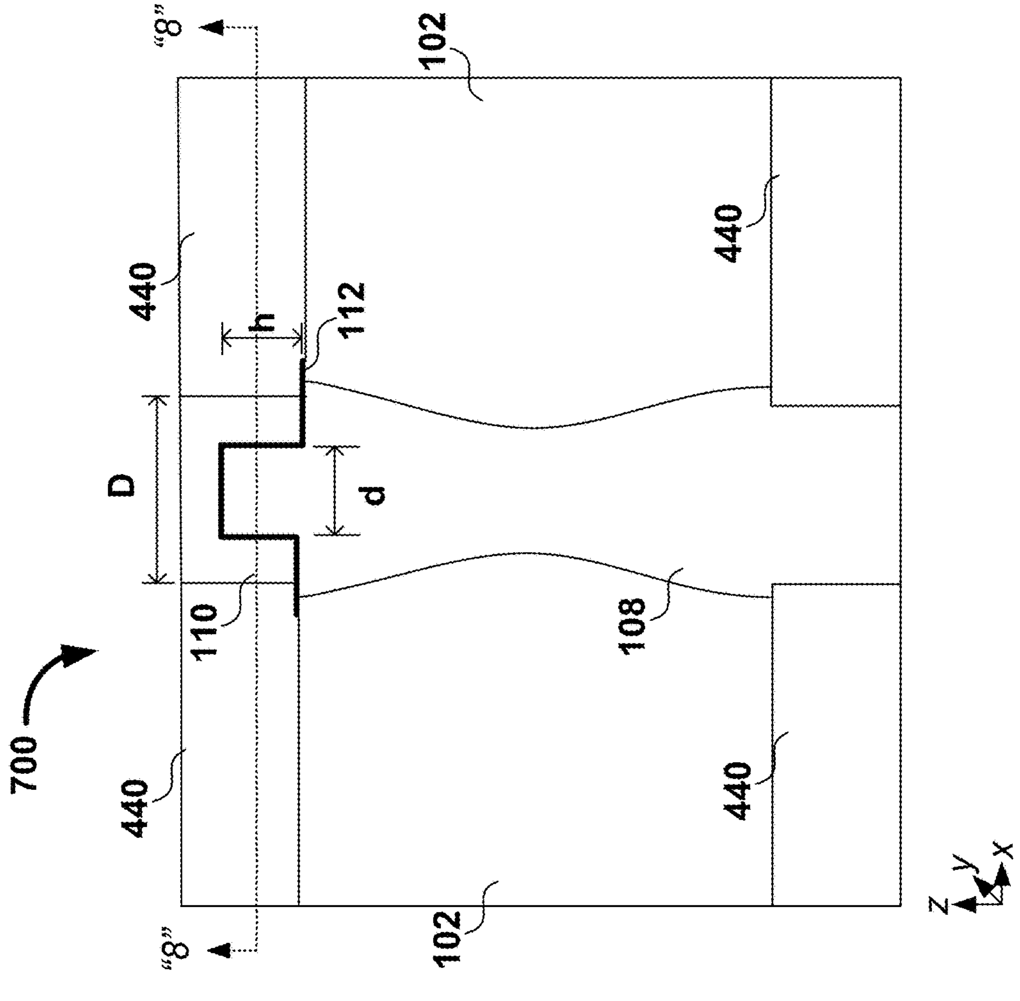
FIG. 7 illustrates, by way of example, a diagram of an embodiment of another 3D TFC created in a two-step (dual) lithography formed via (DLV).

FIG. 7 illustrates, by way of example, a diagram of an embodiment of another 3D TFC 700. The TFC 700 in FIG. 7 is a DLV TFC. The 3D TFC of FIG. 4 is formed completely on a PTH as opposed to the TFC formed in the TGV that is illustrated in FIGS. 1, 2, 3E, 3F, 4, 5, 6E, and 6F.

The 3D TFC 700 of FIG. 7 includes a first electrode that is formed on the TGV using the conductive material 108, the dielectric material 112 that is deposited on the conductive material 108, and a second electrode that is formed using the conductive material 110. A buffer layer 440 can be situated to aid in forming RDL and further layers on top of the 3D TFC 700. Techniques for forming the TFC 700 are illustrated and described regarding FIGS. 9A-9E.

An area of the electrode of the 3D TFC 700 of FIG. 7 is estimated as in Equation 5:

$$\text{Area} = \frac{\pi D^2}{4} + \pi dh \qquad \text{Equation 5}$$

Where h, D, and d are illustrated in FIG. 4. h is the height of the dielectric material 112 in the z-direction. D is a horizontal extent (x-direction) of the conductive material 110. d is an extent of a horizontal portion of the dielectric material 112 that is at about the top-most extent of the dielectric material 112. For a 2D capacitor over the same substrate area as the capacitor of FIG. 7, the area of the conductive plates is $\pi D^2/4$.

Dielectric material 112 and conductive material 108 include a stepped profile in a vertical cross-section. The conductive material 110 includes a profile that mates with the profile of the dielectric material 112 and the conductive material 108.

Figure 8:
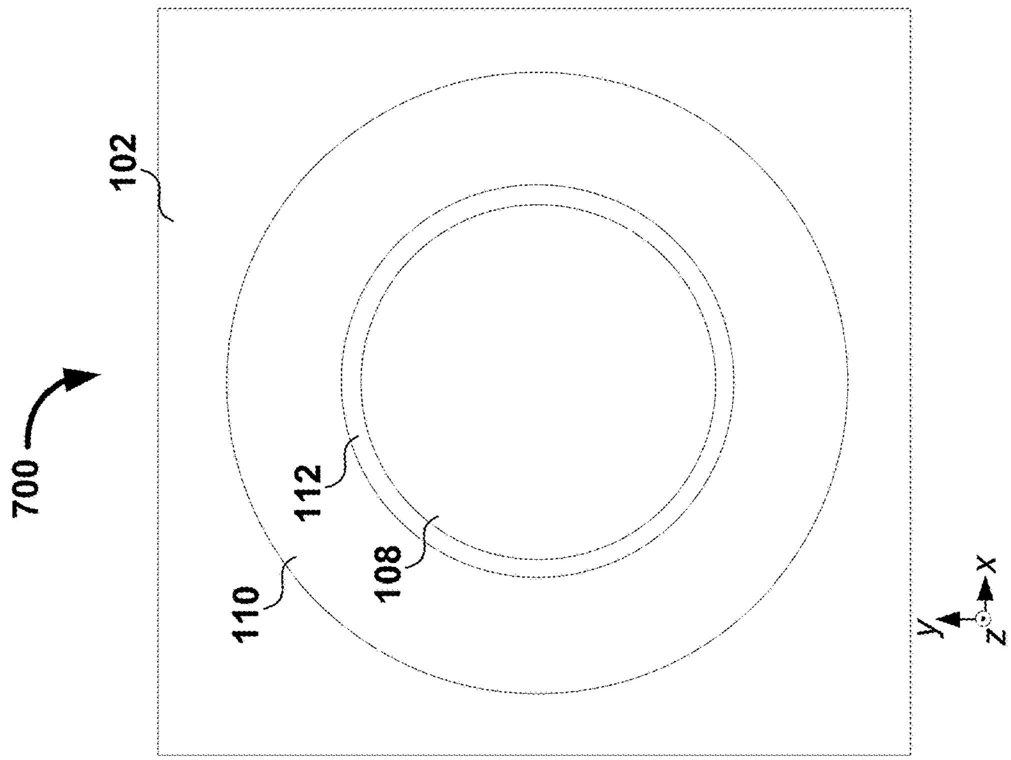
FIG. 8 illustrates, by way of example, a horizontal cross-section of the 3D TFC at a location indicated by arrows labelled "8" in FIG. 7.

FIG. 8 illustrates, by way of example, a horizontal cross-section of the 3D TFC 700 at a location indicated by arrows labelled “8” in FIG. 7. In this view, the materials from the outside on one side to the outside on the opposite side of the 3D TFC 400 are glass core 102, conductive material 110, dielectric material 112, conductive material 108, dielectric material 112, conductive material 110, and glass core 102.

Figure 9A:
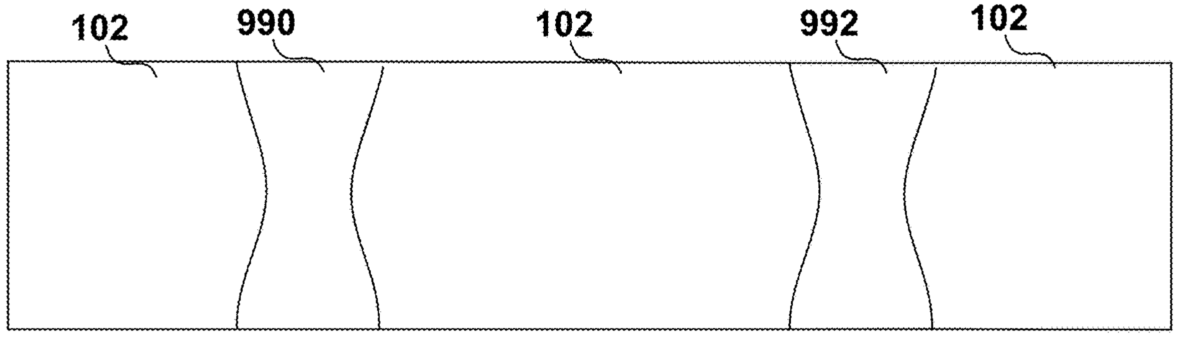
FIGS. 9A-9E illustrate, by way of example, respective stages of generating a device that includes a DLV TFC.

FIGS. 9A-9E illustrate, by way of example, respective stages of generating a device that includes the 3D TFC 700. FIG. 9A illustrates a glass core 102 that has been processed to include PTHs 990, 992. The PTHs 990, 992 can be created by drilling and/or etching away the glass and plating TGVs in the glass core 102.

Figure 9B:
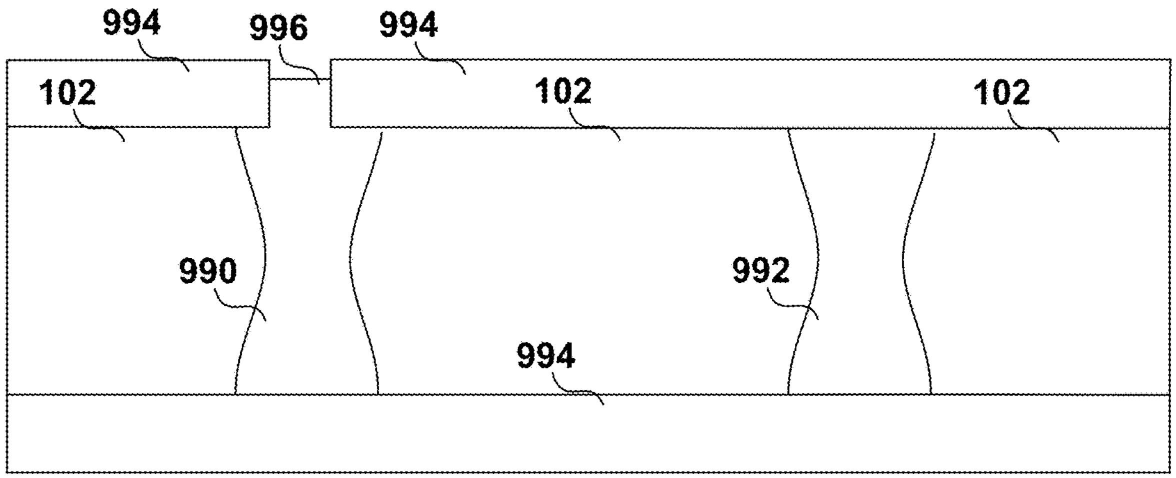

FIG. 9B illustrates the conductive glass core of FIG. 9A after a mask 994 is situated to protect the exposed surfaces of the glass core 102 and the exposed surfaces of the PTH 992. The mask is also situated to cover a portion of a top surface of the PTH 990 but to leave a central portion of the PTH 990 exposed. A conductive material 996 is formed on the exposed portions of the PTH 992. The conductive material 996 forms a pillar on the PTH 990. The PTH 990 and conductive material 996 form a first electrode for a 3D MIM capacitor. A footprint of the conductive material 996 can be smaller and completely within a footprint of the PTH 990.

Figure 9C:
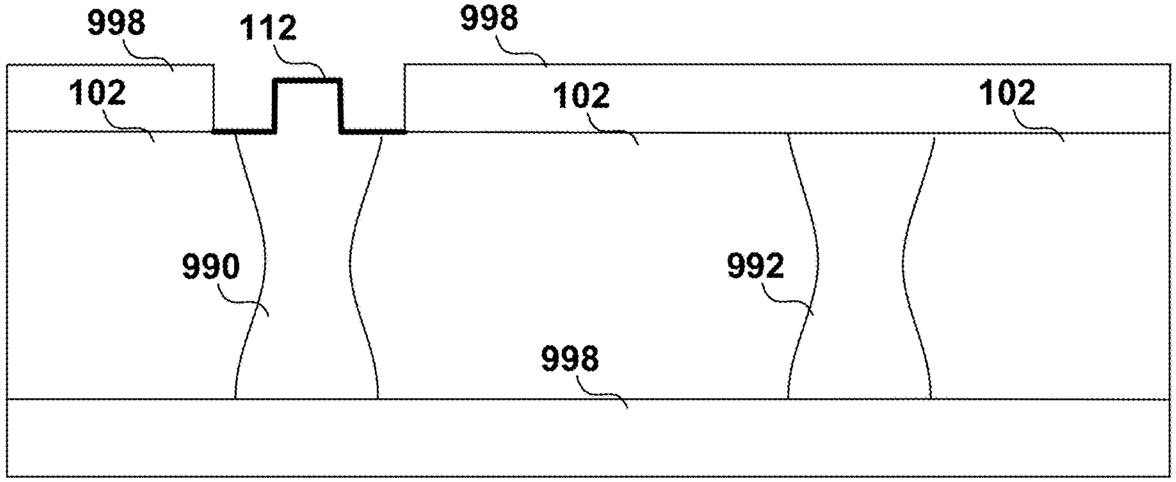

FIG. 9C illustrates the conductive glass core of FIG. 9B after another mask 998 is situated to protect portions of the glass core 102 and the PTH 992. The mask 998 is situated to cover all exposed portions of the PTH 992 and most of the exposed portions of the glass core 102. The glass core 102 immediately adjacent to the PTH 990 remains exposed as does the pillar and the top surface of the PTH 990. The dielectric material 112 is deposited on the exposed portions of the PTH 990, pillar, and glass core 102. The dielectric material 112 can be deposited using an ALD, CVD, iCVD process, or the like. The dielectric material 112 forms an insulator for the 3D MIM capacitor.

Figure 9D:
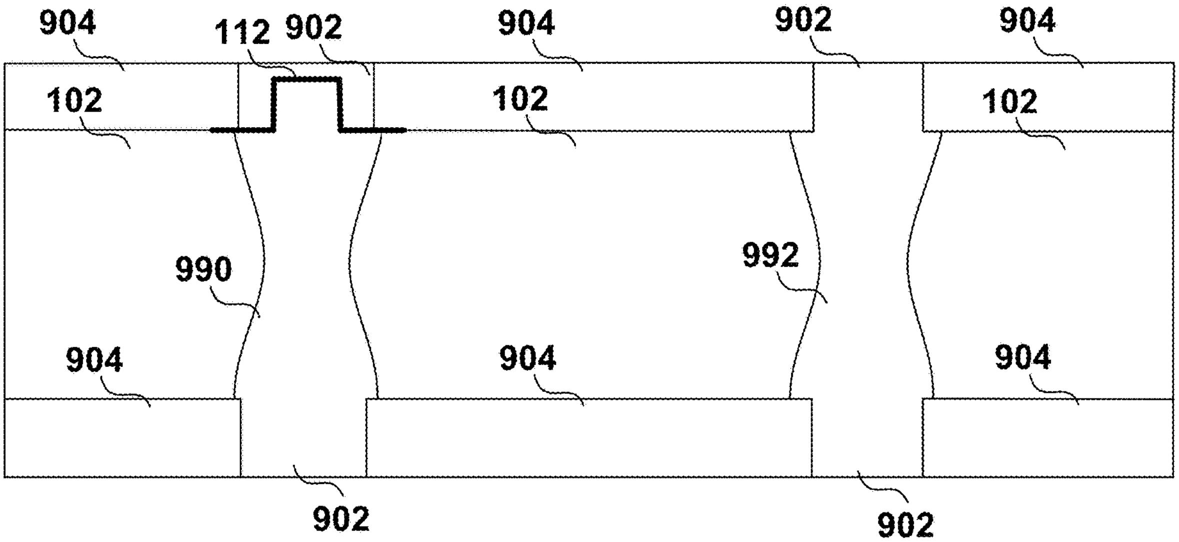

FIG. 9D illustrates the conductive glass core of FIG. 9C after the mask 998 is stripped. The conductive glass core of FIG. 9D includes a mask 904 situated over all exposed portions of the glass core 102 and over the dielectric material 112 that extends outside a footprint of the PTH 990. A conductive material 902 is formed, such by using a litho-defined VIA plating process, on exposed portions of the PTH 992, the dielectric material 112, and the PTH 990. The conductive material 902 in contact with the dielectric material 112 forms the second electrode for a 3D MIM capacitor. Alternative to a masked deposition of the dielectric material 112, the dielectric material 112 can be deposited using a blanket deposition and then etched away in desired locations.

FIG. 9F illustrates the fully formed 3D TFC of FIG. 9D after the mask 904 is removed. A buffer layer 906 is laminated or coated on exposed portions of the glass core 102, dielectric material 112, and PTHs 990, 992. The buffer layer 906 can be processed to expose the conductive material 902. The buffer layer 906 can be processed to be generally coplanar with exposed surfaces of the conductive material 902. Processing the buffer layer 906 can include CMP. The buffer layer 440 can include an ABF or the like.

Figure 9E:
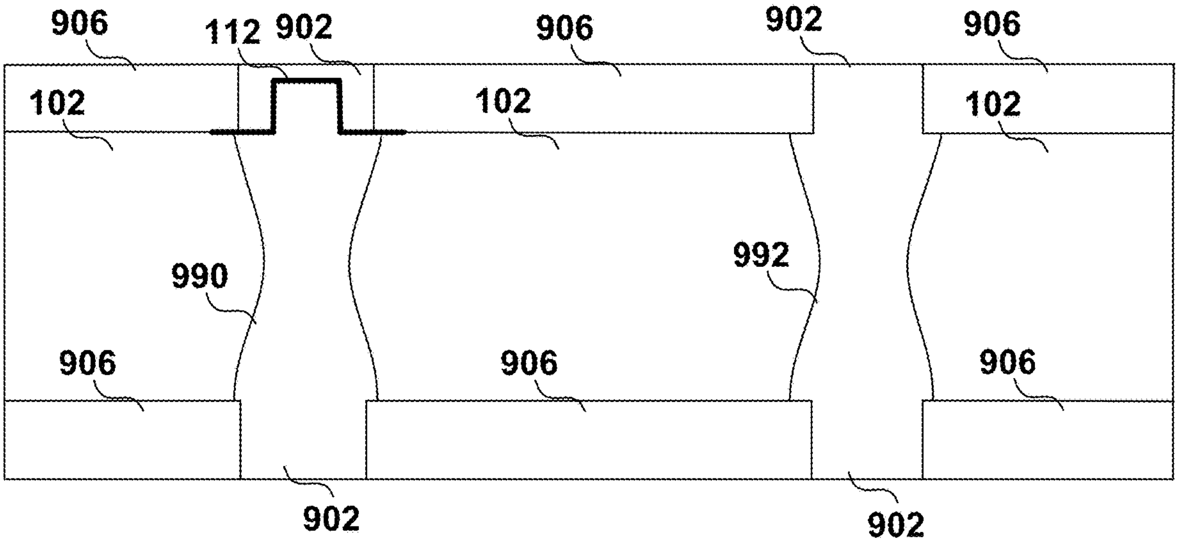

The operations of FIG. 9E can be performed before the operations of FIG. 9D. That is, the buffer layer 906 can be situated before the masking layer 904. If a PID material is used as the buffer layer 906, the CMP process may be avoided.

Any of the masks 342, 344, 352, 680, 994, or 904 can include a dry-film photoresist material. Any of the masks 342, 344, 352, 680, 994, or 904 can be situated and patterned by lithography. Any of the masks 342, 344, 352, 680, 994, or 904 can be removed by a wet resist strip process or a dry etch (“ashing”) process.

Any of the masks 350, 678, or 998 can include a dry-film photoresist material or a methyl-methacrylate (MMA) material. Any of the masks 350, 678, or 998 can be situated and patterned by lithography. Any of the masks 350, 678, or 998 can be removed by a wet resist strip process or a dry etch (“ashing”) process.

Any of the conductive materials 340, 350, 668, 682, 996, 902, or other conductive material such as those used in a TGV to create a PTH can include same or different conductive materials as the conductive material 108, 110.

Figure 10:
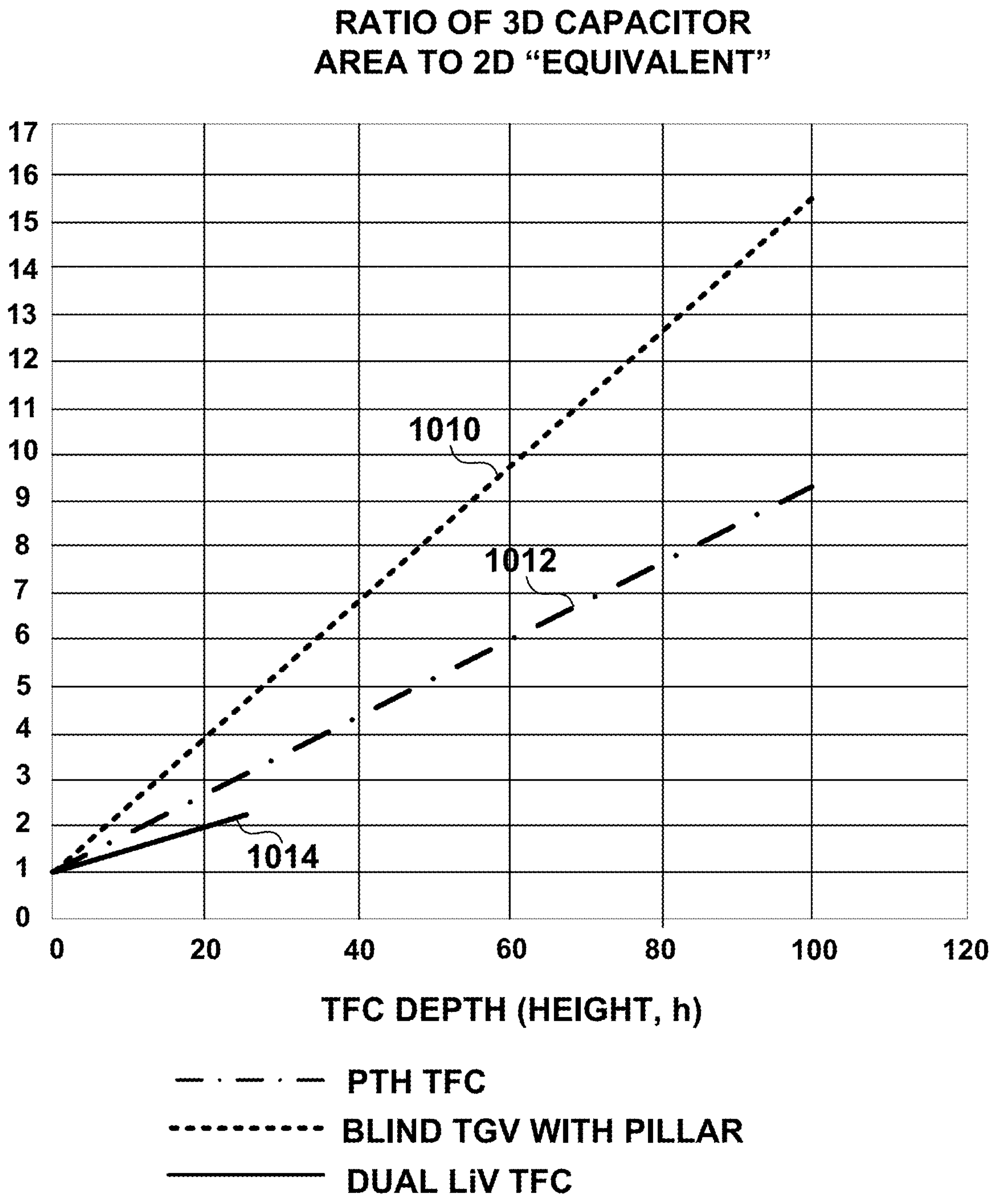
FIG. 10 illustrates, by way of example, a graph of ratio of 3D capacitor area to area of 2D "equivalent" for three 3D MIM capacitor architectures.

FIG. 10 illustrates, by way of example, a graph of ratio of 3D capacitor area to area of 2D “equivalent” for three 3D MIM capacitor architectures. The illustrated architectures include the BTGV with pillar represented by line 1010, PTH TFC represented by line 1012, and DLV TFC illustrated by line 1014. The BTGV with pillar is illustrated and described regarding FIGS. 1-3F. The PTH TFC is illustrated and described regarding FIGS. 4-6F. The DLV TFC is illustrated and described regarding FIGS. 7-9E. As can be seen, the greater the height, h, the greater the capacitance per substrate area consumed. The BTGV with pillar provides the greatest area ratio of the three illustrated architectures. This is at least partially because there are more vertical transitions in the BTGV as the dielectric material 112 lines sidewalls of a hollow cylindrical BTGV.

Figure 12:
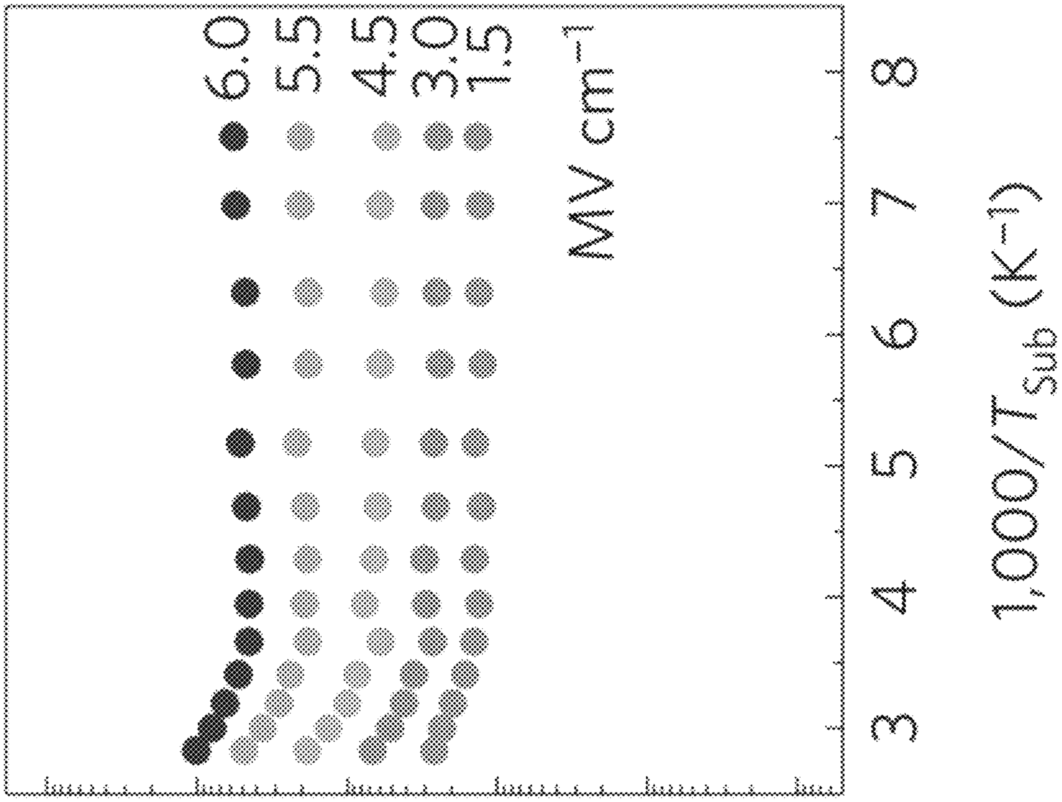
FIGS. 11 and 12 illustrate, by way of example, graphs of performance metrics of a MIM capacitor that includes initiated chemical vapor deposition (iCVD)-deposited dielectric material at different temperatures and voltages.
Figure 11:
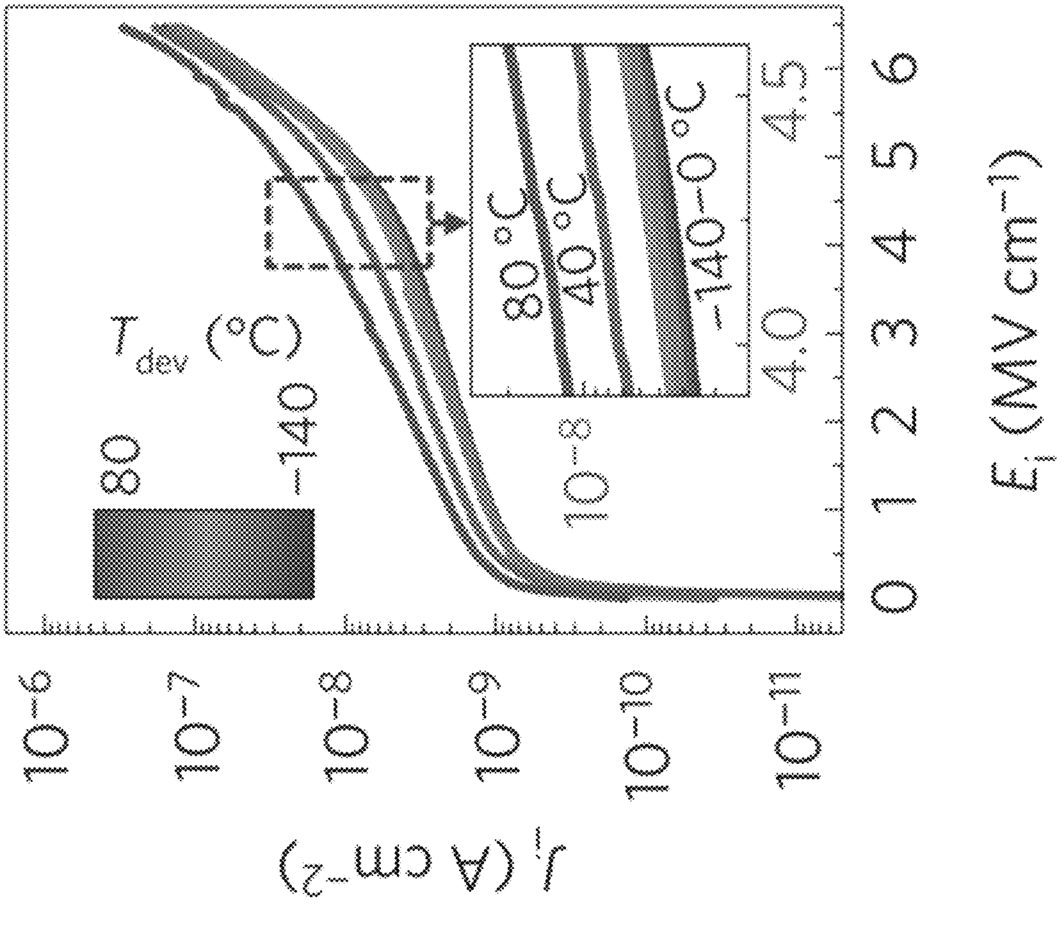

FIGS. 11 and 12 illustrate, by way of example, graphs of performance metrics of a MIM capacitor that includes iCVD-deposited dielectric material at different temperatures and voltages. As can be seen, performance remains consistent across a wide range of temperatures and voltages. This consistency makes the iCVD deposited thin film attractive for MIM capacitor creation.

Figure 13:
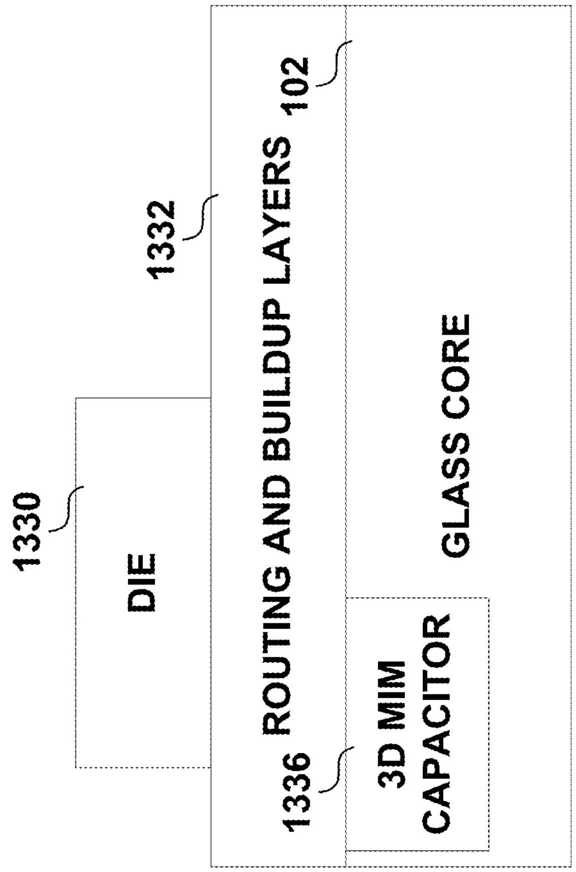
FIG. 13 illustrates, by way of example, an embodiment of a device that includes a 3D MIM capacitor.

FIG. 13 illustrates, by way of example, an embodiment of a device that includes a 3D MIM capacitor 1336. The 3D MIM capacitor 1336 can be created in-situ with the rest of the device. The 3D MIM capacitor 1336 can include any of the 3D MIM capacitors shown or discussed. The 3D MIM capacitor 1336 can be formed at least partially in the glass core 102, at least partially on the glass core 102, or a combination thereof. Routing and buildup layers 1332 can be formed over and electrically connected to the 3D MIM capacitor 1336. The routing and buildup layers 1332 can include routing layers, dielectric layers, redistribution layers (RDLs), electrical or electronic components, or other circuitry.

A die 1330 can be electrically connected to the routing and buildup layers, the 3D MIM capacitor 1336, or a combination thereof. The die 1330 can include an application specific integrated circuit (ASIC), a power distribution die, a central processing unit (CPU), a memory, a wireless communication die, among other dies.

Figure 14:
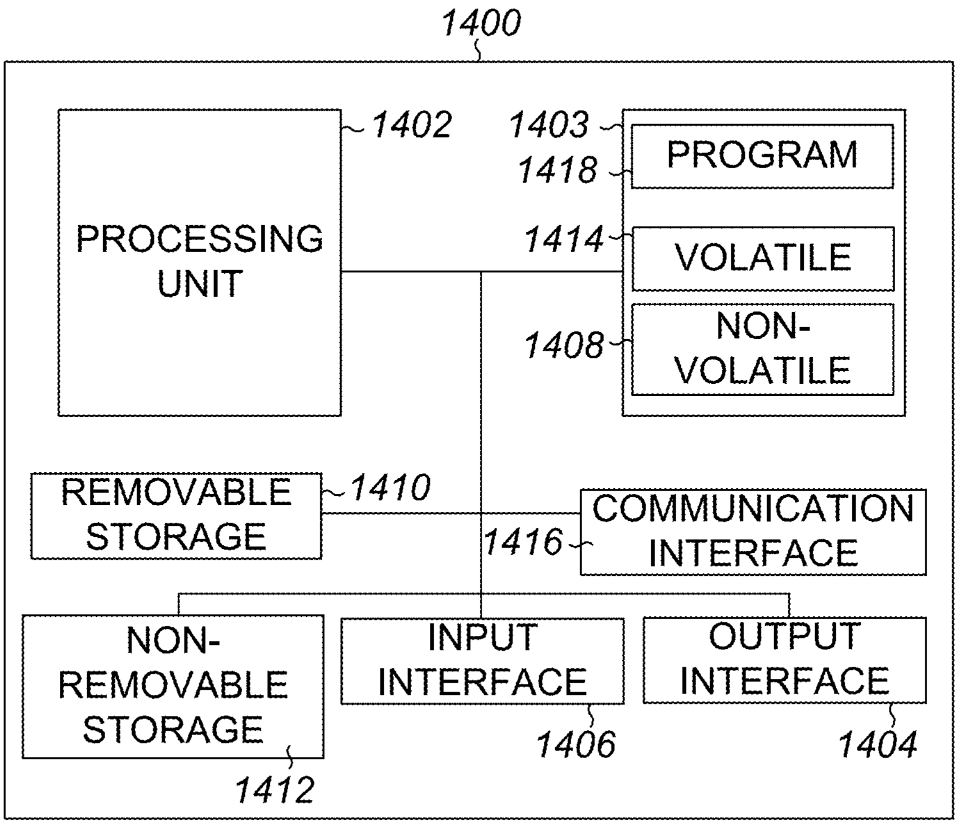
FIG. 14 illustrates, by way of example, a block diagram of an embodiment of a machine (e.g., a computer system) that includes components that can include, or be powered by a device that includes, a 3D MIM capacitor.

FIG. 14 illustrates, by way of example, a block diagram of an embodiment of a machine 1400 (e.g., a computer system) that includes components that can include, or be powered by a device that includes, a 3D MIM capacitor. One example machine 1400 (in the form of a computer), may include a processing unit 1402, memory 1403, removable storage 1410, and non-removable storage 1412. Although the example computing device is illustrated and described as machine 1400, the computing device may be in different forms in different embodiments. Further, although the various data storage elements are illustrated as part of the machine 1400, the storage may also or alternatively include cloud-based storage accessible via a network, such as the Internet.

Memory 1403 may include volatile memory 1414 and non-volatile memory 1408. The machine 1400 may include—or have access to a computing environment that includes—a variety of computer-readable media, such as volatile memory 1414 and non-volatile memory 1408, removable storage 1410 and non-removable storage 1412. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1400 may include or have access to a computing environment that includes input 1406, output 1404, and a communication connection 1416. Output 1404 may include a display device, such as a touchscreen, that also may serve as an input device. The input 1406 may include one or more of a touchscreen, touchpad, mouse, keyboard, camera, one or more device-specific buttons, one or more sensors integrated within or coupled via wired or wireless data connections to the machine 1400, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1402 (sometimes called processing circuitry) of the machine 1400. A hard drive, CD-ROM, and RAM are some examples of articles including a non-transitory computer-readable medium such as a storage device. For example, a computer program 1418 may be used to cause processing unit 1402 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry", "processing circuitry", or "processor" as used herein thus refers to, is part of, or includes circuitry capable of sequentially and automatically carrying out a sequence of arithmetic or logical operations, or recording, storing, and/or transferring digital data. These terms may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a three-dimensional (3D) capacitor comprising a glass core, a through glass via (TGV) in the glass core including first conductive material, the first conductive material forming a first electrode of the 3D capacitor, a second conductive material acting as a second electrode of the 3D capacitor, and a dielectric material in contact with the first and second conductive materials, the dielectric material extending vertically and horizontally and physically separating the first and second conductive materials.

In Example 2, Example 1 further includes a blind TGV (BTGV) in the glass core, wherein the first conductive material extends into the BTGV and covers sidewalls of the BTGV.

In Example 3, Example 2 further includes, wherein the dielectric material extends into the BTGV and covers the first conductive material in the BTGV, the dielectric material separated from the glass core by the first conductive material in the BTGV.

In Example 4, Example 3 further includes, wherein the second conductive material covers the dielectric material and fills the BTGV.

In Example 5, at least one of Examples 2-4 further includes, wherein the BTGV is a hollow cylindrical trench in the glass core with a glass core pillar in a center of the trench.

In Example 6, Example 5 further includes, wherein the first conductive material is in contact with the pillar, the dielectric material is on and in contact with the first conductive material directly over the pillar, and the second conductive material is on and in contact with the dielectric material directly over the pillar.

In Example 7, at least one of Examples 1-6 further includes, wherein the dielectric material includes a "U" shape extending vertically from a top surface of the glass core toward an opposing bottom surface of the glass core in the TGV.

In Example 8, at least one of Examples 1-7 further includes a third conductive material in contact with and extending beyond a top surface of the TGV.

In Example 9, Example 8 further includes, wherein the third conductive material includes a footprint within and smaller than a footprint of the TGV.

In Example 10, Example 9 further includes, wherein the dielectric material is over and in contact with the TGV.

In Example 11, Example 10 further includes, wherein the third conductive material includes a stepped profile in a vertical cross-section thereof.

In Example 12, Example 11 further includes, wherein the second conductive material is in contact with and includes a profile that mates with the stepped profile of the first conductive material.

In Example 13, at least one of Examples 1-12 further includes, wherein the dielectric material is deposited using a conformal deposition process.

In Example 14, Example 13 further includes, wherein the conformal deposition process includes initiated chemical vapor deposition (iCVD).

Example 15 includes a method of in-situ forming a three-dimensional (3D) capacitor on a package, the method comprising forming a through glass via (TGV) in a glass core, forming a first electrode (i) in the TGV, (ii) at least partially on and including the TGV, or (iii) at least partially in a blind TGV (BTGV) adjacent the TGV, conformally depositing a dielectric material directly on the first electrode, the dielectric material extending vertically and horizontally, and forming a second electrode on and in contact with the dielectric material.

In Example 16, Example 15 further includes, wherein forming the first electrode includes forming a first electrode in the TGV such that the dielectric material includes a "U" shape extending into the TGV.

In Example 17, at least one of Examples 15-16 further includes, wherein forming the first electrode includes forming a first electrode at least partially on and including the TGV such that the dielectric material includes a stepped profile in a vertical cross-section.

In Example 18, at least one of Examples 15-17 further includes, wherein forming the first electrode includes forming the first electrode at least partially in the BTGV adjacent the TGV.

In Example 19, at least one of Examples 15-18 further includes, wherein conformally depositing the dielectric material includes using initiated chemical vapor deposition (iCVD).

In Example 20 a device comprises a three-dimensional (3D) metal-insulator-metal (MIM) capacitor comprising a glass core, a through glass via (TGV) in the glass core including first conductive material, the first conductive material forming a first electrode of the 3D MIM capacitor, a second conductive material acting as a second electrode of the 3D MIM capacitor, and a dielectric material in contact with the first and second conductive materials, the dielectric material extending vertically and horizontally and physically separating the first and second conductive materials, electrical routing electrically connected to, on, and in contact with the 3D MIM capacitor, and a die on and electrically connected to the electrical routing.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three-dimensional (3D) capacitor comprising:
a glass core;
a through glass via (TGV) in the glass core including a first conductive material, the first conductive material forming a first electrode of the 3D capacitor;
a second conductive material acting as a second electrode of the 3D capacitor; and
a dielectric material in contact with the first and second conductive materials, the dielectric material extending vertically and horizontally and physically separating the first and second conductive materials.

2. The 3D capacitor of claim 1, further comprising:
a blind TGV (BTGV) in the glass core;
wherein the first conductive material extends into the BTGV and covers sidewalls of the BTGV.

3. The 3D capacitor of claim 2, wherein the dielectric material extends into the BTGV and covers the first conductive material in the BTGV, the dielectric material separated from the glass core by the first conductive material in the BTGV.

4. The 3D capacitor of claim 3, wherein the second conductive material covers the dielectric material and fills the BTGV.

5. The 3D capacitor of claim 2, wherein the BTGV is a hollow cylindrical trench in the glass core with a glass core pillar in a center of the trench.

6. The 3D capacitor of claim 5, wherein the first conductive material is in contact with the pillar, the dielectric material is on and in contact with the first conductive material directly over the pillar, and the second conductive material is on and in contact with the dielectric material directly over the pillar.

7. The 3D capacitor of claim 1, wherein:
the dielectric material includes a "U" shape extending vertically from a top surface of the glass core toward an opposing bottom surface of the glass core in the TGV.

8. The 3D capacitor of claim 1, further comprising a third conductive material in contact with and extending beyond a top surface of the TGV.

9. The 3D capacitor of claim 8, wherein the third conductive material includes a footprint within and smaller than a footprint of the TGV.

10. The 3D capacitor of claim 9, wherein the dielectric material is over and in contact with the TGV.

11. The 3D capacitor of claim 10, wherein the third conductive material includes a stepped profile in a vertical cross-section thereof.

12. The 3D capacitor of claim 11, wherein the second conductive material is in contact with and includes a profile that mates with the stepped profile of the first conductive material.

13. The 3D capacitor of claim 1, wherein the dielectric material is conformal.

14. A device comprising:
a three-dimensional (3D) metal-insulator-metal (MIM) capacitor comprising:
a glass core;
a through glass via (TGV) in the glass core including a first conductive material, the first conductive material forming a first electrode of the 3D MIM capacitor;
a second conductive material acting as a second electrode of the 3D MIM capacitor; and
a dielectric material in contact with the first and second conductive materials, the dielectric material extending vertically and horizontally and physically separating the first and second conductive materials;
electrical routing electrically connected to, on, and in contact with the 3D MIM capacitor; and
a die on and electrically connected to the electrical routing.

15. The device of claim 14, further comprising:
a blind TGV (BTGV) in the glass core;
wherein the first conductive material extends into the BTGV and covers sidewalls of the BTGV.

16. A method of in-situ forming a three-dimensional (3D) capacitor on a package, the method comprising:
forming a through glass via (TGV) in a glass core;
forming a first electrode (i) in the TGV, (ii) at least partially on and including the TGV, or (iii) at least partially in a blind TGV (BTGV) adjacent the TGV;
conformally depositing a dielectric material directly on the first electrode, wherein the dielectric material extending vertically and horizontally, and wherein conformally depositing the dielectric material includes using initiated chemical vapor deposition (iCVD); and
forming a second electrode on and in contact with the dielectric material.

17. The method of claim 16, wherein forming the first electrode includes forming a first electrode in the TGV such that the dielectric material includes a "U" shape extending into the TGV.

18. The method of claim 16, wherein forming the first electrode includes forming a first electrode at least partially on and including the TGV such that the dielectric material includes a stepped profile in a vertical cross-section.

19. The method of claim 16, wherein forming the first electrode includes forming the first electrode at least partially in the BTGV adjacent to the TGV.

* * * * *